United States Patent [19]

Iida

[11] Patent Number: 4,587,664
[45] Date of Patent: May 6, 1986

[54] HIGH SPEED FREQUENCY DIVIDER DIVIDING PULSE BY A NUMBER OBTAINED BY DIVIDING AN ODD NUMBER BY TWO

[75] Inventor: Norihiko Iida, Tokyo, Japan
[73] Assignee: NEC Corporation, Tokyo, Japan
[21] Appl. No.: 653,109
[22] Filed: Sep. 21, 1984

[30] Foreign Application Priority Data

Sep. 21, 1983 [JP] Japan .................. 58-174610
Nov. 1, 1983 [JP] Japan .................. 58-205204

[51] Int. Cl.⁴ .............. H03K 23/42; H03K 23/48; H03K 23/52
[52] U.S. Cl. ................... 377/48; 377/121; 377/104; 377/116; 377/117
[58] Field of Search .......... 377/48, 111, 104, 116, 377/117, 121

[56] References Cited

U.S. PATENT DOCUMENTS

| | | | |
|---|---|---|---|
| 3,930,169 | 12/1975 | Kuhn | 377/117 |
| 3,976,946 | 8/1976 | Schroder | 377/48 |
| 4,041,403 | 8/1977 | Chiapparoli | 377/48 |
| 4,114,052 | 9/1978 | Manabe et al. | 377/121 |
| 4,295,158 | 10/1981 | Nissen et al. | 377/48 |
| 4,348,640 | 9/1982 | Clendening | 377/48 |
| 4,354,188 | 10/1982 | Schneider | 377/48 |
| 4,399,549 | 8/1983 | Sriuastaua | 377/116 |

Primary Examiner—John S. Heyman
Attorney, Agent, or Firm—Sughrue, Mion, Zinn, Macpeak and Seas

[57] ABSTRACT

An 8.5 divider comprises a first and second ½ dividers to produce output pulses having phases different from each other by 90°, a first logic gate producing output pulses having a repetition frequency of a half of the input pulses, a third and fourth ½ dividers connected in series and dividing twice the output pulses of the first logic gate by two, a fifth ½ divider receiving the output of the fourth ½ divider, a second logic gate detecting the simultaneous presence of the outputs of the second, third and fifth ½ dividers to invert the phase of the output pulses of the first ½ divider and a third logic gate detecting the simultaneous presence of the outputs of the first and third ½ dividers and the inverted output of the fifth ½ divider.

13 Claims, 8 Drawing Figures

HIGH SPEED FREQUENCY DIVIDER DIVIDING PULSE BY A NUMBER OBTAINED BY DIVIDING AN ODD NUMBER BY TWO

BACKGROUND OF THE INVENTION

1. Field of the Invention:

This invention relates to a frequency divider, and particularly to a circuit for dividing a pulse frequency by a number obtained by dividing an odd number by two.

2. Description of the Prior Art:

A frequency divider using a programmable counter has been used in various apparatus such as a Phase Locked Loop (PLL) frequency synthesizer. As a means for improving a Carrier Noise Ratio (CNR) in such a PLL frequency synthesizer, a frequency divider dividing pulses by a number obtained by dividing an odd number by two is successfully employed.

An example of a known frequency divider has a counter made of a plural number of series-connected flip-flops counting input pulses and a means for changing a phase of the input pulses in response to an output from the counter obtained at a time when the counting value becomes a predetermined number. The phase changing means consists of a first AND circuit directly receiving input pulses from an input terminal, a second AND circuit receiving the input pulses through an inverter, an OR circuit receiving outputs from the first and second AND circuits and a flip-flop producing, in response to the output from the counter, an output to be applied to the first AND circuit and an inverted output to be applied to the second AND circuit. In accordance with the output and the inverted output from the flip-flop, one of the first and second AND circuits passes the input pulses or the inverted input pulses, and thus the change of phase of the input pulses is achieved.

Since the first and second AND circuit pass the input pulses and inverted input pulses in accordance with the output and the inverted output from the flip-flop, the timings of the input (or inverted input) pulses and the output (or inverted output) from the flip-flop are important to achieve a normal operation. However, when the input pulses become high frequency, a mismatching of their timings is apt to occur and destroys the normal operation. Therefore, the frequency divider in the prior art has a limit in operable frequency of the input pulses.

SUMMARY OF THE INVENTION

The primary object of the present invention is to provide a divider which can divide a high frequency of input pulses by a number obtained by dividing an odd number by two.

The present invention provides a frequency divider comprising a first and a second ½ dividers driven by input pulses and producing outputs having phases different from each other by 90°, a circuit means for transferring the outputs of the first and second ½ dividers which have a repetition frequency of a half of the input pulses, a pulse counter counting the transferred pulses, a control signal generator producing a control signal and an inverted control signal, a first means for changing the phase of the output of the first ½ divider in response to the simultaneous occurrences of the control signal, the output of the counter and the output of the second ½ divider and a second means for changing the phase of the output of the second ½ divider in response to the simultaneous occurrences of the inverted control signal, the output of the counter and the output of the first ½ divider.

The present invention detects the simultaneous occurrence of the control or inverted control signal, the output of the counter and the output of the first or second ½ divider, all of which have lower frequencies than the input pulses. Therefore, the repetition frequency of input pulses can be increased to the frequency twice of the frequency of input pulses which is applicable to the divider in the prior art.

BRIEF DESCRIPTION OF THE DRAWINGS

The above and further objects, features and advantages of the present invention will become more apparent from the following detailed description taking in conjunction with the accompanying drawings, wherein.

Figure 1:
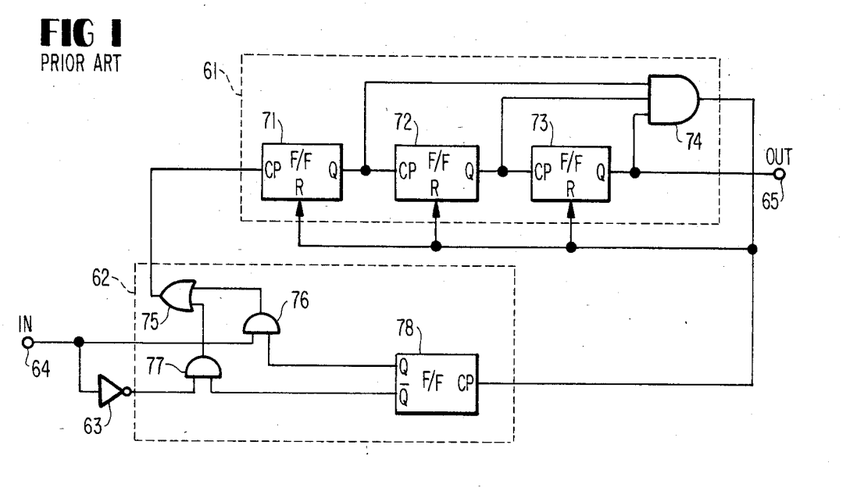
FIG. 1 is a circuit diagram showing a frequency divider in the prior art.

The frequency divider in the prior art has a pulse counter 61, an input pulse changing circuit 62, an inverter 63, an input terminal 64 and an output terminal 65, as shown in FIG. 1. Input pulses received at the input terminal 64 is directly applied to an AND circuit 76 on the one hand, and applied to an AND circuit 77 through an inverter 63 on the other hand. The AND circuits 76 and 77 are alternately activated by the outputs Q and $\overline{Q}$ of the flip-flop 78 to pass the input pulses or the inverted input pulses. The input (or inverted input) pulses passed through the AND circuits 76 and 77 are applied to the counter 61 through an OR circuit 75. The counter 61 comprises three (or arbitrary number) series-connected flip-flops 71, 72 and 73 and an AND circuit 74. All outputs from the flip-flops 71, 72 and 73 are applied to the AND circuit 74 whose output is used to reset all the flip-flops 71, 72 and 73 and to change, or invert, the outputs Q and $\overline{Q}$ of the flip-flop 78.

At an initial state, the flip-flop 78 produces a high level signal (hereinafter, referred to as a level "H") at the output $\overline{Q}$ and a low level signal (hereinafter, referred to as a level "L") at the output Q. The input pulses are applied to the counter 61 through the inverter 63, the AND circuit 77 and the OR circuit 75, resulting in an application of input pulses in a sequence of "L", "H", "L", "H" . . . The counter 61 does not count first "L". When the counter 61 counts the successive seven "H"'s, the AND circuit 74 produces an output to reset all the flip-flops 71, 72 and 73 and to change the outputs Q and $\overline{Q}$ of the flip-flop 78 to "H" and "L", respectively. As a result, the output of the flip-flop 73 becomes a divided signal of input pulses by seven and a half. Thereafter, the input pulses are applied to the counter 61 through the AND circuit 76 and the OR circuit 75 in a sequence of "L", "H", "L", "H" . . . Accordingly, the AND circuit 74 produces an output by the same operation, after the counter 61 counts seven and a half of input pulses. In this way, the divider divides the input pulses by seven and a half.

In the input pulse changing circuit 62, the AND gate 76 receives and passes the input pulses under a control of the output Q of the flip-flop 78. If the timings of the input pulses and the output Q are mismatched, the divider no longer operates normally as a seven and a half divider. This mismatching becomes remarkable as the frequency of input pulses rises. Therefore, frequency divider in the prior art has a disadvantage that applicable frequency of input pulses in low.

DESCRIPTION OF THE PREFERRED EMBODIMENTS

Figure 2:
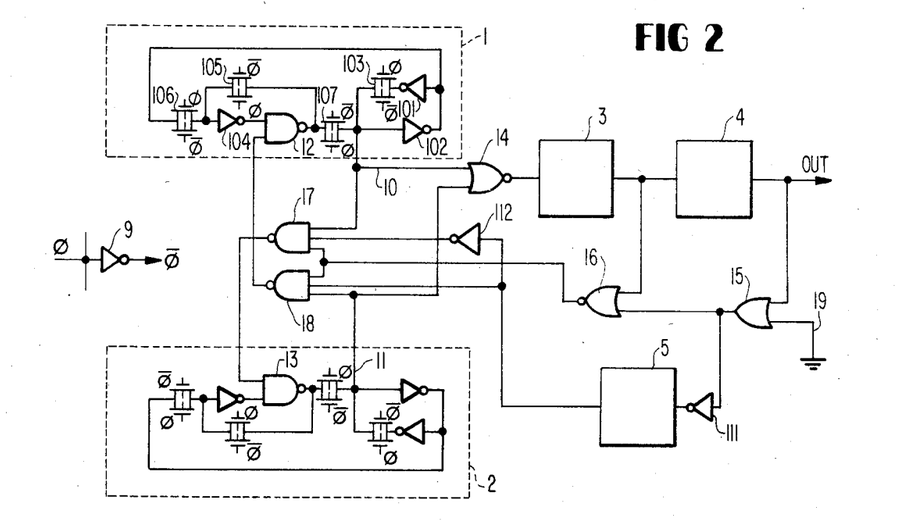
FIG. 2 is a circuit diagram of a first embodiment of the present invention.

A first embodiment of the invention shown in FIG. 2 comprises five ½ dividers 1 to 5. The ½ divides 1 and 2 are shown in detail in the boxes of dash lines. Two inverters 101 and 102 and a transfer gate 103 of P- and N-channel FFT's form closed loop. Similarly, an inverter 104, a NAND gate 12 and a transfer gate 105 form another closed loop. Two closed loops are connected with each other by transfer gates 106 and 107 to form a larger closed loop. The other ½ dividers 3 to 5 have a similar construction to the ½ dividers 1 and 2 except that the NAND gate 12 is replaced with an inverter. Output of the ½ inverters 1 and 2 are applied to a NOR gate 14 through lines 10 and 11, and then applied to the ½ divider 3 whose output goes to the ½ divider 4. An output OUT of the whole divider is obtained from the ½ divider 4. The output OUT and the ground potential at line 19 are applied to an OR gate 15. Although the line 19 is held at the ground potential for operating the whole circuit as a 1/8.5 divider, it may be held at a high potential for operating the whole circuit as a ⅛ divider. The output from the OR gate 15 is applied on the one hand to a NOR gate 16 together with the output from the ½ divider 3, and on the other hand to the ½ divider 5 through an inverter 111. Three outputs from the NOR gate 16 and the ½ dividers 2 and 5 are applied to a NAND gate 18 whose output is applied to the NAND gate 12 of the ½ divider 1. The output of the NOR gate 16, the output of ½ divider 1 and the inverted output of the ½ divider 5 are applied to the NAND gate 17 whose output is applied to the NAND gate 13 in the ½ divider 2.

Figure 3:
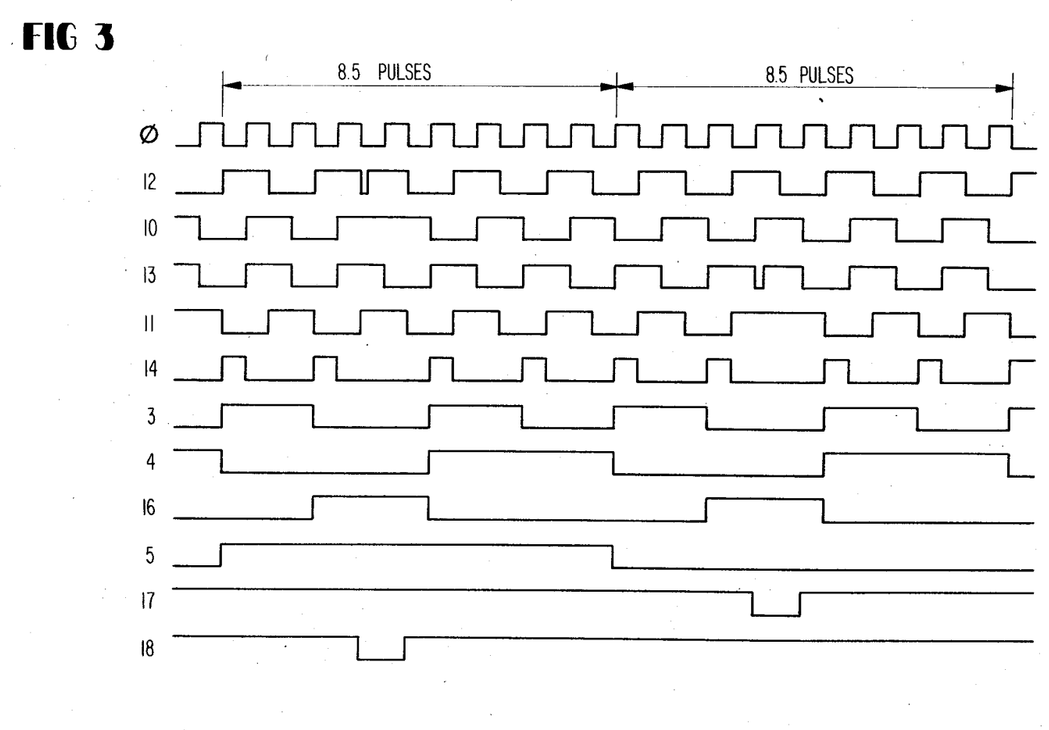
FIG. 3 is a timing chart for explaining the operation of the first embodiment.

The 1/8.5 dividing operation will be explained with reference to FIG. 3. Numerals in FIG. 3 mean the outputs of the respective circuits and gates in FIG. 2 having the same numerals or the signals at lines having the same numerals.

The input pulses $\phi$ are applied to an inverter 9 to form inverted input pulses $\bar{\phi}$. The input and inverted input pulses $\phi$ and $\bar{\phi}$ are applied to transfer gates 103, 105, 106 and 107 in the ½ dividers 1 and 2. As a result, the ½ dividers 1 and 2 produce output signals of a half frequency at lines 10 and 11, but the output signals at lines 10 and 11 are different in phase from each other by 90° as shown in FIG. 3. The NOR gate 14 receives the signals at the lines 10 and 11 and generates a pulse signal having a pulse width similar to the input pulses and a repetition frequency which is a half of the input pulses. This signal 14 and its inverted signal (not shown) are applied to the transfer gates in the ½ divider 3 and divided in frequency by two by the ½ divider 3. The output of the divider 3 is applied together with its inverted signal (not shown) to the transfer gates in the divider 4 and divided in frequency by two.

When a first input pulse $\phi$ is applied, the output of the ½ divider 3 is at level "H", while that of the ½ divider 4 is at level "L". When a third input pulse is applied, the output of the ½ divider 3 is at level "L", causing an output of "H" of the NOR gate 16. Then, in response to the change of the input pulse to "L", the signal level at the line 11 rises to "H" and produces an output of "L" of the NAND gate 18. In response to the application of "L" signal to the NAND gate 12, the ½ divider 1 stops its counting operation. After the output of the NAND gate 18 returns to "H" and an input pulse is then applied, the ½ divider 1 resumes its normal operation but the phase of its output is inverted. Therefore, the generation of output from the NOR gate 14 is delayed by a half of the cycle period of the input pulse. At the same time of the delayed output generation, the output of the ½ divider 3 and 4 rise to "H" by which the output of the NOR gate 16 is maintained at "L" to keep the outputs of the NAND gates 17 and 18 at "H". The output of the ½ divider 4 is maintained at "H" during successive three input pulse periods. In this way, first eight and a half input pulses are counted.

For next eight and a half input pulses, the ½ divider 5 changes its output to "L" in response to the change in the output of the ½ divider 4 to "L". Therefore, after next three input pulses, the NAND gate 17 produces a "L" level output which is applied to the NAND gate 13 to stop the operation of the ½ divider 2. The ½ divider 2 resumes its operation in response to fifth input pulse. This temporary stop inverts the phase of the output of the ½ divider 2 and delays the generation of output of the NOR gate 14 for a half of the cycle period of the input pulse. The change of outputs of the ½ dividers 3 and 4 are also delayed for the same period. Thereafter, the output of the ½ divider 4 is kept at "H" during next four input pulse periods. The one cycle of the output of the ½ divider 4 becomes equal to a duration of eight and a half input pulses.

By repeating the above operation, the whole circuit divides the input pulses by eight and a half. In this operation, the phase of the input pulses is not changed. The phases of the outputs of the ½ dividers 1 and 2 are inverted by the outputs of the ½ dividers 2 and 1, the ½ divider 3 and the ½ divider 5, repetition frequencies of which are all lower than the input pulses. The timings of these outputs are not mismatched until the frequency of the input pulse becomes double of that applicable to the frequency divider in the prior art.

Figure 4:
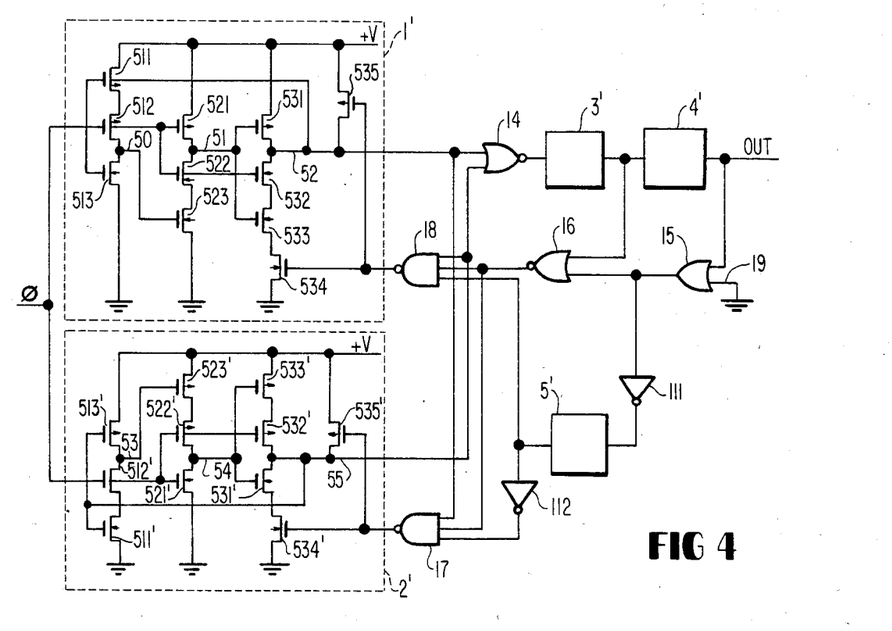
FIG. 4 is a circuit diagram of a second embodiment of the present invention.

A second embodiment of the present invention shown in FIG. 4 uses dynamic type ½ dividers as the ½ dividers 1', 2', 3', 4', and 5', which are driven by single-phase input signals. The ½ dividers 1', 3', 4', and 5' have the same circuit arrangement made of CMOS transistors, but the ½ divider 2' has a circuit arrangement modified to generate a 90° shifted output with respect to the output of the divider 1'. The two dividers 1' and 2' are driven by the same input clock pulse $\phi$. The five dividers 1' to 5' are interconnected in the same manner as in FIG. 2 via the same gates as in FIG. 2 which are indicated in FIG. 4 by the same reference numerals as in FIG. 2. The ½ divider 1', 3', 4' and 5' each include three gates which are connected to form a closed loop. A first gate is made of P-MOS FET's 511 and 512 and an N-MOS FET 513. The P-MOS FET 512 receives input pulses at its gate. The P- and N-MOS FET's 511 and 513 receive a feedback signal at their gates from an output node 52. The second gate is constructed of a P-MOS FET 521 and two N-MOS FET's 522 and 523. The P- and N-MOS FET's 521 and 522 receive input pulses at their gates. The N-MOS FET 523 receives an output of the first gate from a connecting point 50. The remaining C-MOS gate is comprised of two P-MOS FET's 531 and 535 and three N-MOS FET's 532, 533 and 534. A pair of the P- and N-MOS FET's 531 and 533 receives the output of the second gate from the connecting point 51. The P-MOS FET 532 receives the input pulses at its gate. The N-MOS FET 534 and the P-MOS FET 535 receive the output of the NAND gate 18 which temporarily stops the operation of the ½ divider 1'. An output pulse of a half frequency of the input pulse is derived at the output node 52.

The ½ divider 2' has a similar circuit to the ½ divider 1', 3', 4' or 5'. The transistors 511' to 513', 521' to 523', and 531' to 533' correspond to transistors 511 to 513, 521 to 523, and 531 to 533 in the ½ divider 1' but have an opposite conductivity. Therefore, they are denoted by the same reference numerals with a dash added. Three C-MOS gates are connected to form a closed loop through connecting points 53 and 54 and an output node 55. The output, node 55 generates a ½ divided output which has a phase different from the output of the divider 1' by 90°.

The ½ dividers 3', 4' and 5' have the same circuit arrangement as the ½ divider 1' except for the P-MOS FET 535 and the N-MOS FET 534 which are not required for those ½ dividers 3', 4' and 5' because they do not receive a control signal.

Figure 5:
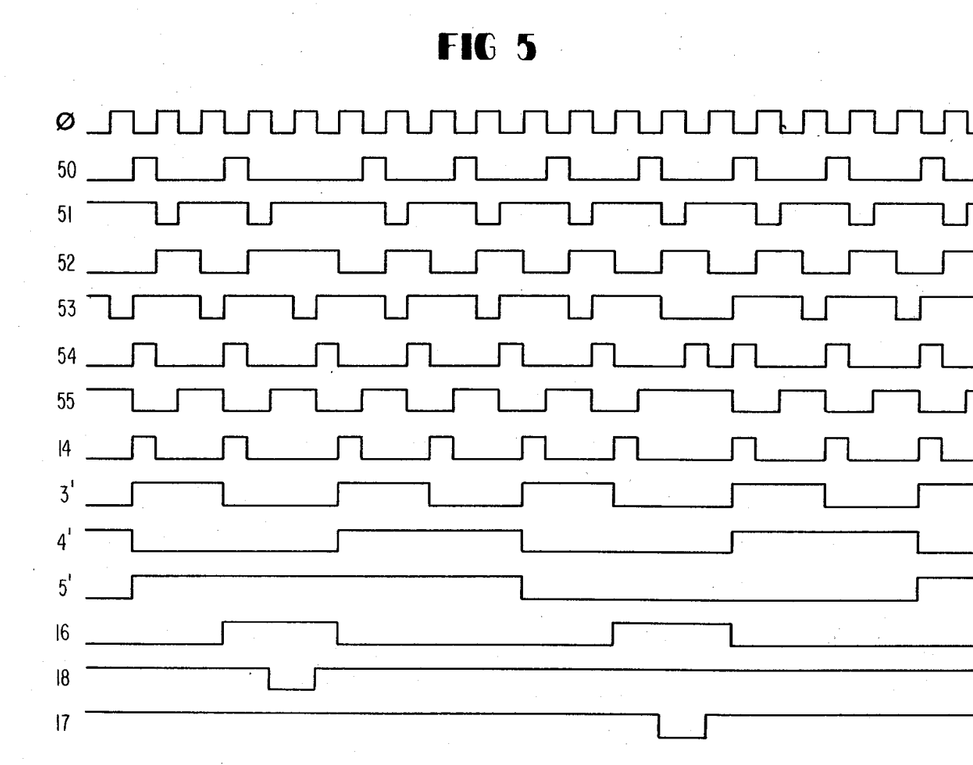
FIG. 5 is a timing chart for explaining the operation of the second embodiment.

The operation will be explained with reference to FIG. 5. At the initial state, the output of the ½ divider 5' is "L". In response to the change of the output of the ½ divider 4', the output of the ½ divider 5' becomes "H". For next eight and half pulse duration, while the signal at the connecting point 53 has a uniform repetition frequency, the duration between second and third pulses of the signal at the connecting point 50 is prolonged for two repetition cycle of the input pulses by the output from the NAND gate 18. The signal at the connecting point 51 is an inverted signal of the signal at the connecting point 50. The second pulse of the signal at the output node 52 is prolonged for one repetition cycle of the input pulses $\phi$. In other words, the phase of the output of the ½ divider 1' is inverted at the time of fifth pulse of the input pulses $\phi$. Thereafter, the ½ dividers 1',3' and 4' count four inverted input pulses until the output of the ½ divider 4' returns to "L" state. For the next eight and half input pulses, the same phase inversion occurs in the signal at the output node 55 by the output from the NAND gate 17. By the similar operation to the above, the output of the ½ divider 2' produces one repetition cycle of pulses for eight and half input pulses.

In this way, 8.5 dividing operation is achieved, almost similarly to the first embodiment. According to the second embodiment, since dynamic type dividers are used as the ½ dividers 1' to 5', the operable frequency is higher than the first embodiment using static type dividers. This means that the applicable input pulses can have a higher frequency than the first embodiment. Further, the second embodiment does not require the inverted input pulses. The number of transistors forming the ½ divider is very small. For these two reasons, the 8.5 divider of the second embodiment is very simple in construction. As a modification of the second embodiment, the one of the P- and N-MOS FET's 535(535') and 534(534') may be removed. Further, although the P- and N-MOS FET's 535(535') and 534(534') are connected to the third C-MOS gate in the ½ dividers 1' and 2' to form a NAND gate, the FET's 535(535') and 534(534') may be connected to the third C-MOS gates so as to form a NOR gate together with changes of the NOR gate 14 to an AND gate and the NAND gates 17 and 18 to NOR gates.

Figure 6:
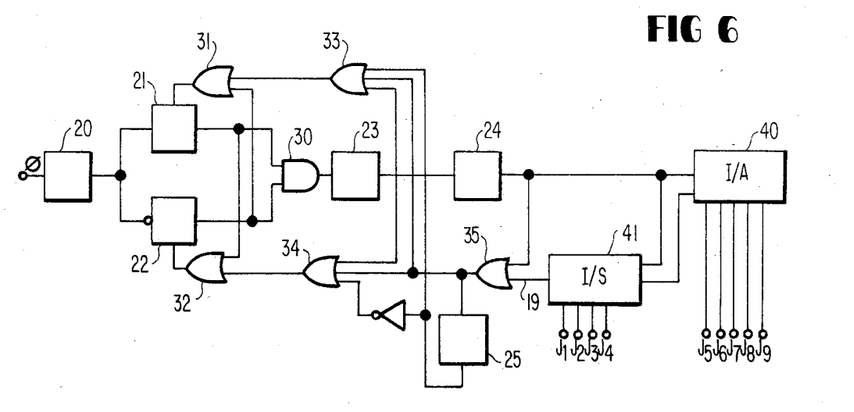
FIG. 6 is a circuit diagram of a third embodiment of the present invention.

The third embodiment shown in FIG. 6 is changeable in the operation between an 8 divider and an 8.5 divider, and is suited to be used in a programable counter of a pulse swallow type. Input pulses are applied to ½ dividers 21 and 22 through a ½ divider 20. The ½ divider 20 is applied to divide the frequency of the input pulse $\phi$ by 16 and 17. However, to divide input pulses by 8 and 8.5, the ½ divider 20 may be removed. The outputs of the ½ dividers 21 and 22 have phases different from each other by 90° and are applied to an AND gate 30. The output is applied to a ½ divider 23 and then to a ½ divider 24. The output of the ½ divider 24 is applied to an OR gate 35. The output from the OR gate 35 is applied to a ½ divider 25 and OR gates 33 and 34. The OR gate 33 receives three signals from the ½ dividers 23 and 25 and the OR gate 35. The OR gate 34 receives outputs from the ½ divider 23 and the OR gate 35 and the inverted output from the ½ divider 25 through an inverter. The output of the OR gate 33 is applied to an OR gate 31 together with the output of the ½ divider 22. The output of the OR gate 31 is applied to the ½ divider 21 to change the phase of the output of the divider 21 by 180°. An OR gate 32 receives output from the OR gate 34 and the ½ divider 21 and output a signal to the ½ divider 22 to change the phase of the output of the divider 22 by 180°.

The circuit part including the ½ dividers 21, 22, 23, 24 and 25 divides the frequency of the output pulse of the ½ divider 20 by 8.5 in response to grounding the line 19, as explained in the explanations of the first and second embodiments. When the potential at the line 19 is high, because the output of the ½ divider 25 is fixed, the mentioned circuit part divides the output pulse of the divider 20 by 8. To switch over the potential at the line 19, is provided a counter 41 having program inputs J₁, J₂, J₃ and J₄ to set a dividing ratio S. Therefore, the mentioned circuit part divides the pulse by 8 (or 16) when the number of outputs from the ½ divider 24 becomes "S" and otherwise the circuit part divides the pulse by 8.5 (or 17).

The output of the ½ divider 24 is applied to the counter 41 and a programable counter 40. The programable counter 40 has program inputs J₅, J₆, J₇, J₈ and J₉ to set a dividing rate A. The Final output is obtained from the counter 40.

Figure 7:
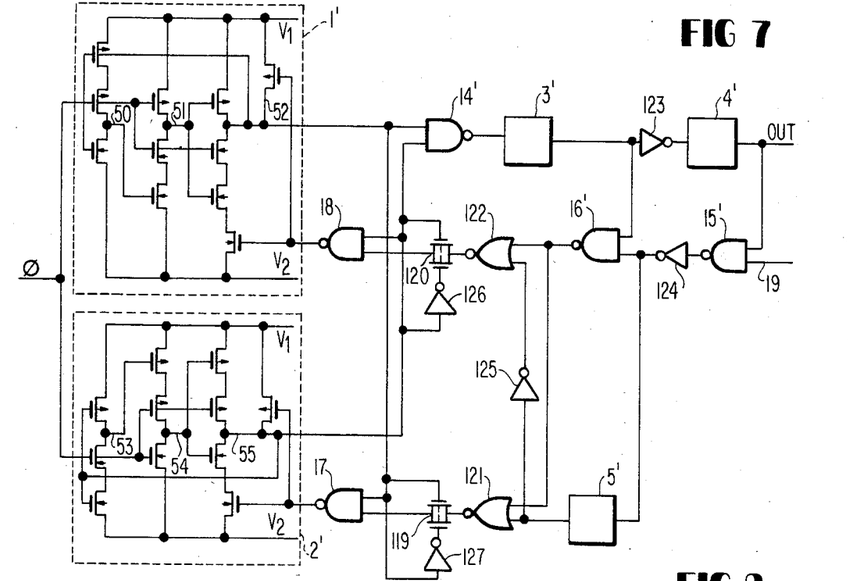
FIG. 7 is a circuit diagram of a fourth embodiment of the present invention.
Figure 8:
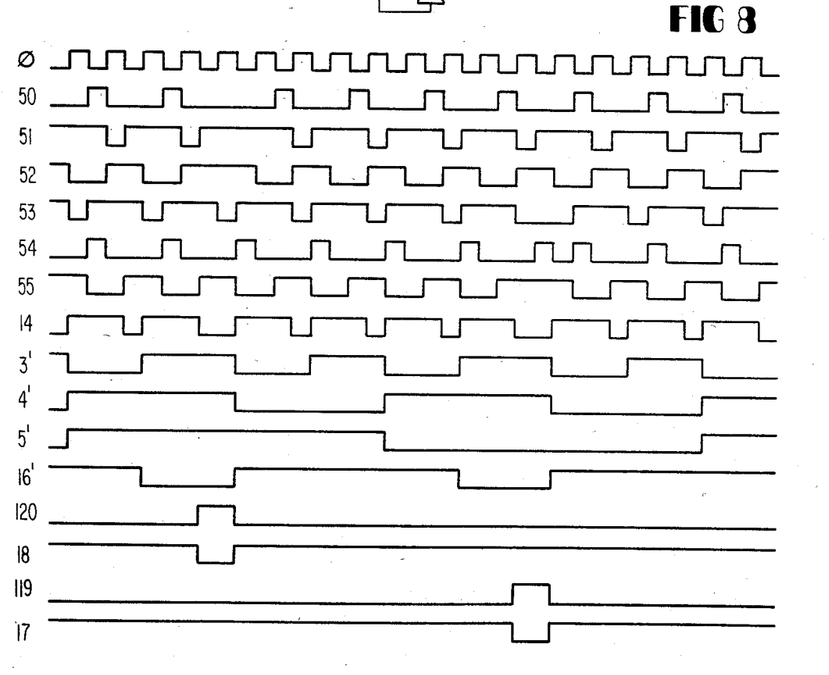
FIG. 8 is a timing chart for explaining the operation of the fourth embodiment.

The fourth embodiment shown in FIG. 7 improves the timing for the temporal stop of the input stage ½ dividers 1' and 2' in the second embodiment shown in FIG. 4 by insertion of transfer gates 119 and 120. The circuit is basically similar to the second embodiment shown in FIG. 4. The same numerals are used for the corresponding parts. Dynamic type dividers are used as the ½ dividers 1', 2', 3', 4', and 5'. The outputs of the ½ dividers 1' and 2' are applied to NAND gate 14'. Therefore, the output signal from the NAND gate 14' is opposite to the NOR gate 14 in the second embodiment, as shown in FIG. 8. The output of the NAND gate 14' is applied to the ½ divider 3'. The ½ divider 3' applies its output to the ½ divider 4' through an inverter 123 and to a NAND gate 16'. The output of the ½ divider 4' is a final output and is also applied to a NAND gate 15' together with the external control signal at the line 19. When the external control signal is high, the fourth embodiment operates as an 8.5 divider. When the external control signal is at a ground level, it operates as an 8 divider. The output of the NAND gate 15' is applied to the NAND gate 16' and the ½ divider 5' through an inverter 124. The output signals of the dividers 3' and 4' and the NAND gate 16' are signals opposite to the signals of the corresponding outputs in the second embodiment, as shown in FIG. 8. The output of the NAND gate 16' is applied to NOR gates 121 and 122. The output of the ½ divider 5' is directly applied to a NOR gate 121 and to a NOR gate 122 through an inverter 125. The output of the NOR gate 121 is applied to the NAND gate 17 through the transfer gate 119 which is controlled by the output of the ½ divider 1'. Similarly, the output of the NOR gate 122 is applied to the NAND gate 18 through the transfer gate 120 controlled by the output of the ½ divider 2'. Inverters 126 and 127 are provided for applying inverted output signals of the ½ dividers 1' and 2' to the transfer gates 120 and 119. The NAND gate 17 receiving the outputs of the ½ divider 1' and the transfer gate 119 produces an output to temporarily stop the operation of the ½ divider 2'. Due to the temporal stop, the output of the ½ divider 2' changes its phase by 180°. Another NAND gate 18 receiving the outputs of the ½ divider 2' and the transfer gate 120 produces an output to stop temporarily the operation of the ½ divider 1'. Due to the temporal stop, the phase of the output of the ½ divider 1' is changed by 180°.

The transfer gate 120 passes the output of the NOR gate 122 during the output period of the ½ divider 2', as shown in FIG. 8. The timings of application of outputs of the ½ divider 2' and the NOR gate 122 to the NAND gate 18 is always matched. Similarly, the timing matching of application of outputs of the ½ divider 1' and the NOR gate 121 to the NAND gate 17 is always kept by the transfer gate 119. If the phase difference between outputs of the ½ dividers 1' and 2' is not exactly 90°, there is a prossibility of maloperation in the first to third embodiments. However, such maloperation is completely prevented by the transfer gates 119 and 120 in the fourth embodiment.

Although some embodiments of the present invention are explained with reference to the drawings, it is apparent for the skilled in the art that the invention is not limited to the above-explained embodiments. Any kinds of flip-flops may be used as the ½ dividers. The logic gates may be changed with other kinds of logic gates with or without adequate changes or arrangements of the circuit construction. For example, the NOR gates 14 in the first and second embodiments may be replaced with the AND gate 30 as used in the third embodiment or with the NOR gate 14 as used in the fourth embodiment. The OR gates 15 may be changed with the NAND gate 15' together with the insertion of the inverter 123 as shown in FIG. 7. The NOR gates 16 may be changed with the NAND gate 16' together with the insertion of the NOR gates 121 and 122 as shown in FIG. 7.

What is claimed is:

1. A divider comprising:
   an input terminal receiving input pulses;
   a first divider dividing the frequency of said input pulses received at said input terminal and producing first pulses;
   a second divider dividing the frequency of said input pulses received at said input terminal and producing second pulses having a phase different from said first pulses by 90°;
   a first means for synthesizing third pulses having a repetition frequency lower than said input pulses from said first and second pulses;
   a counter driven by said third pulses;
   an output terminal coupled with said counter;
   a second means coupled to said counter for selecting one of said first and second pulses in response to the output of said counter; and
   a third means coupled to said first means and said first and second dividers and responsive to the selected one of said first and second pulses and the output of said counter for shifting the phase of the other of said first and second pulses by 180°.

2. A divider as claimed in claim 1, wherein said first and second dividers are ½ frequency dividers, respectively.

3. A divider as claimed in claim 2, wherein said ½ frequency dividers are static type frequency dividers.

4. A divider as claimed in claim 2, wherein said ½ frequency dividers are dynamic type frequency dividers.

5. A divider as claimed in claim 1, wherein said counter includes at least one ½ frequency divider.

6. A divider as claimed in claim 1, wherein said third means includes a fourth means for generating a first signal in response to the outputs of said second means and said counter and said second pulse to be applied to said first divider and a fifth means for generating a second signal in response to the outputs of said second means and said counter and said first pulse to be applied to said second divider.

7. A divider as claimed in claim 6, wherein said outputs of said second means and said counter are applied to said fourth means in synchronism with said second pulse and said outputs of said second means and said counter are applied to said fifth means in synchronism with said first pulse.

8. A divider comprising:
   a first ½ divider receiving input pulses and producing first pulses of which repetition frequency is a half of said input pulses, said first ½ divider having a first means for temporarily stopping the operation thereof;
   a second ½ divider receiving said input pulses and producing second pulses of which repetition frequency is a half of said input pulses, the phase of said second pulses being different from said first pulses by 90°, said second ½ divider having a second means for temporarily stopping the operation thereof;
   a first NOR gate receiving said first and second pulses;
   a third ½ divider receiving the output of said NOR gate and producing third pulses of which repetition frequency is a half of said first and second pulses;
   a fourth ½ divider receiving the output of said third pulses and producing fourth pulses of which repetition frequency is a half of said third pulses;
   an output means for deriving said fourth pulses as output pulses;
   an OR gate receiving said fourth pulses and a switching signal;
   a fifth ½ divider receiving said fourth pulses and producing a first control signal and a second control signal of which repetition frequencies are a half of said fourth pulses, said second control signal having an inverted relationship with said first control signal;

a second NOR gate receiving said third pulses and the output of said OR gate;

a first NAND gate receiving said first control signal, the output of said second NOR gate and said second pulses to apply an output signal to said first means to stop temporarily the operation of said first ½ divider; and a second NAND gate receiving said second control signal, the output of said NOR gate and said first pulses to apply an output signal to said second means to stop temporarily the operation of said second ½ divider.

9. A divider as claimed in claim 8, wherein said first, second, third, fourth and fifth ½ dividers are static type.

10. A divider as claimed in claim 8, wherein said first, second, third, fourth and fifth ½ dividers are dynamic type.

11. A divider comprising:
a first, second, third, fourth and fifth ½ dividers dividing input pulses to produce output pulses having a repetition frequency of a half of said input pulses, the output of said second ½ divider having a phase different from the output of said first ½ divider by 90°;

a first means for applying input signal pulses to said first and second ½ dividers;

a second means for deriving the output pulses of said fourth ½ divider as output signal pulses;

a AND gate receiving said output pulses of said first and second ½ dividers and applying output pulses to said third ½ divider;

a third means for applying the output pulses of said third ½ divider to said fourth ½ divider;

a first OR gate receiving the output signal of said fourth ½ divider and a switch signal, the output of said first OR gate being applied to said fifth ½ divider;

a second OR gate receiving the outputs of said third and fifth ½ dividers and said first OR gate;

an inverter inverting the output of said fifth ½ divider;

a third OR gate receiving the outputs of said third ½ divider, said inverter and said first OR gate;

a fourth OR gate receiving the outputs of said second ½ divider and said second OR gate, the output of said fourth OR gate being applied to said first ½ divider to temporarily stop the operation of said first ½ divider;

a fifth OR gate receiving the outputs of said third OR gate and said first ½ divider, the output of said fifth OR gate being applied to said second ½ divider to temporarily stop the operation of said second ½ divider; and a fourth means for generating said switch signal controlling the dividing ratio of the circuit including said first, second, third, fourth and fifth ½ dividers, said AND gate, said inverter, said first, second, third, fourth and fifth OR gates and said first, second and third means.

12. A divider as claimed in claim 11, wherein said fourth means is a counter of the output pulses of said fourth ½ divider.

13. A divider comprising:
a first, second, third, fourth and fifth ½ dividers, respectively, dividing input pulses by two to produce output pulses having a repetition frequency of a half of said input pulses, each of said first to fifth ½ divider having an input node receiving said input pulses and an output node producing said output pulses, and the output pulses of said second ½ divider having a phase different from the output pulses of said first ½ divider by 90°;

an input means for receiving and applying input signal pulses to said first and second ½ dividers;

an output means for deriving the output of said fourth ½ divider as an output signal pulses;

a first NAND gate receiving the output pulses of said first and second ½ dividers and applying an output to said output node of said third ½ divider;

a first inverter inserted between the output node of said third ½ divider and the input node of said fourth ½ divider;

a second NAND gate receiving the output of said fourth ½ divider and a switching signal;

a second inverter inverting the output of said second NAND gate; and applying an output to said fifth ½ divider;

a third NAND gate receiving the outputs of said third ½ divider and said inverter;

a third inverter inverting the output of said fifth ½ divider;

a first NOR gate receiving the outputs of said third NAND gate and said third inverter;

a second NOR gate receiving the output of said third NAND gate and said fifth ½ divider;

a first transfer gate transferring the output of said first NOR gate in synchronism with the output of said second ½ divider;

a second transfer gate transferring the output of said second NOR gate in synchronism with the output of said first ½ divider;

a fourth NAND gate receiving the output of said second ½ divider and the output of said first NOR gate transferred through said first transfer gate, the output of said fourth NAND gate being applied to said first ½ divider to temporarily stop of operation of said first ½ divider;

a fifth NAND gate receiving the output of said first ½ divider and the output of said second NOR gate transferred through said second transfer gate, the output of said fifth NAND gate being applied to said second ½ divider to temporarily stop the operation of said second ½ divider; and a means for generating said switching signal.

* * * * *